United States Patent [19]

De Anda

[11] Patent Number: 4,754,867
[45] Date of Patent: Jul. 5, 1988

[54] AUTOMATED BELT DRIVE FOR PC BOARD FEED APPARATUS

[75] Inventor: Jesus T. De Anda, Chicago, Ill.

[73] Assignee: Zenith Electronics Corporation, Glenview, Ill.

[21] Appl. No.: 909,436

[22] Filed: Sep. 19, 1986

[51] Int. Cl.⁴ .............................................. B65G 43/08
[52] U.S. Cl. .............................. 198/464.2; 198/861.5; 198/817; 198/836; 198/572
[58] Field of Search ...................... 198/836, 817, 861.1, 198/861.5, 464.2, 592, 572

[56] References Cited

U.S. PATENT DOCUMENTS

| | | | |
|---|---|---|---|
| 3,193,081 | 7/1965 | Harrison et al. | 198/572 |
| 3,239,216 | 3/1966 | Pfleger | 198/464.2 X |
| 3,965,523 | 6/1976 | Elliot | 198/817 X |
| 4,188,861 | 2/1980 | Kroeze et al. | 198/592 X |
| 4,274,529 | 6/1981 | Mori et al. | 198/861.1 X |
| 4,507,908 | 4/1985 | Seragnoli | 198/572 X |
| 4,542,820 | 9/1985 | Maxner | 198/817 |
| 4,631,812 | 12/1986 | Young | 198/817 X |
| 4,640,056 | 2/1987 | Stump | 198/836 X |

FOREIGN PATENT DOCUMENTS

| | | | |
|---|---|---|---|
| 1434430 | 5/1976 | United Kingdom | 198/836 |
| 2001608 | 2/1979 | United Kingdom | 198/836 |

Primary Examiner—Robert J. Spar
Assistant Examiner—D. Glenn Dayoan

[57] ABSTRACT

A printed circuit (PC) board feed apparatus includes a feed roller arrangement adapted to receive sequentially delivered PC boards and to position the PC boards in lateral edge engaging contact with a pair of aligned, linear support rails. The opposed lateral edges of each of the PC boards are directed by a respective pivoting idler/guide roller into a guide slot in each of the parallel support rails. Once positioned in the spaced, facing guide slots, the PC boards are sequentially engaged and displaced by a pair of pneumatically actuated roller/drive belt assemblies positioned adjacent to the guide slots. A pneumatic cylinder displaces a first plurality of engaging rollers in each roller/drive belt assembly in a timed manner toward and away from an adjacent respective drive roller/belt combination so as to sequentially position each of the PC boards in contact with the pair of roller/drive belt assemblies for sequentially displacing the edge-to-edge arranged PC boards in a stepwise manner. The PC board feed apparatus includes various adjustable controls to allow for high speed displacement and automatic positioning of PC boards having a range of widths as well as for adjustable lateral and vertical positioning of the PC board receiving and discharge portions of the apparatus for precise alignment with PC board supply and receiving apparatus. The PC board feed apparatus further includes a sensor for automatically shutting down the apparatus in the event the PC boards become misaligned or jammed during transport.

18 Claims, 4 Drawing Sheets

AUTOMATED BELT DRIVE FOR PC BOARD FEED APPARATUS

BACKGROUND OF THE INVENTION

This invention relates generally to the handling of printed circuit (PC) boards and is particularly directed to apparatus for the automatic, high speed transport and precise positioning of PC boards in a sequential manner.

The generally flat, board-like element upon which an electronic circuit is fabricated in many electronic apparatus is typically referred to as "the substrate", or circuit board, and is used primarily for mechanical support and insulating purposes. The conductive elements coupling circuit components are typically in the form of elongated metal foil which may be positioned on one or both sides of the circuit board. Electronic components are increasingly placed in position on the PC board by automatic, robot-like handling devices which allow for more reliable, faster PC board assembly. The PC board itself is increasingly being handled by high speed, automatic displacement and positioning apparatus in order to expedite PC board fabrication, assembly and testing.

In order to facilitate the high speed fabrication and assembly of PC boards, each PC board should be substantially planar, or flat, and should be provided with a substantially uniform array of conductive leads and apertures for receiving and mounting various electronic components on the board. Misalignment between component leads or terminals and the circuit board apertures is frequently due to the nonplanar character of the circuit board. Distortions in the flatness of the circuit board, or warpage, may arise from various factors such as irregularities in the manufacturing process, excessive heat or moisture in the circuit board storage environment, or mishandling of the circuit boards following their fabrication. Even relatively minor out-of-flatness distortions in a circuit board may preclude its high speed handling and result in misalignment between the mounting apertures in the board and the component leads to be inserted therein.

Prior art high speed PC board transport arrangements are generally capable of only handling PC boards having a very high degree of flatness and are susceptible to jamming when handling warped PC boards. Jamming of the PC board transport apparatus results in down time, thus prolonging the time required for PC board manufacturing and increasing production costs. In addition, jamming of the PC board transport apparatus generally requires intervention by production personnel and increases safety risks and the likelihood of injury in an environment where a large number of PC boards are moved at high speeds. Frequently the prior art PC board transport device itself caused distortion, breakage or damage to the PC board. For example, many PC board transport devices make use of roller arrangements which engage a planar surface of the PC board and contact printed information thereon resulting in distortion or erasure of this printed information which is relied upon by assemblers for the correct positioning of various electronic components on the PC board. In addition, prior art PC board transport devices are generally slower than other apparatus used in the processing of the PC boards, e.g., stamping and punching machinery, and thus represent a bottleneck, or delay, in the PC board assembly operation.

The present invention does not suffer from the aforementioned limitations of the prior art and thus represents an improvement thereover. The PC board feed apparatus of the present invention makes use of a belt drive arrangement for sequentially engaging each of a plurality of end-to-end arranged PC boards for linearly displacing the PC boards at high speed while maintaining the PC boards in alignment by means of a pair of spaced slots engaging respective lateral edge portions of the PC boards. A pair of idler rollers guide respective leading edge portions of the PC boards into the support rail slots, while a sensor detects misalignment of the PC boards for automatically shutting down a PC board loader mechanism to prevent jamming of the PC board feed apparatus.

OBJECTS OF THE INVENTION

Accordingly, it is an object of the present invention to provide an improved automatic PC board feed mechanism.

It is another object of the present invention to provide more reliable and accurate positioning of PC boards during their automatic assembly and the incorporation of circuitry thereon.

Yet another object of the present invention is to provide automatic PC board feed and positioning apparatus for the high speed, precise positioning of the PC boards which is capable of accommodating PC boards having a range of sizes, thicknesses and configuration distortions.

A further object of the present invention is to provide a PC board transport mechanism which is capable of high speed operation, is not susceptible to PC board jamming, and automatically rejects damaged PC boards.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENT

Figure 1:
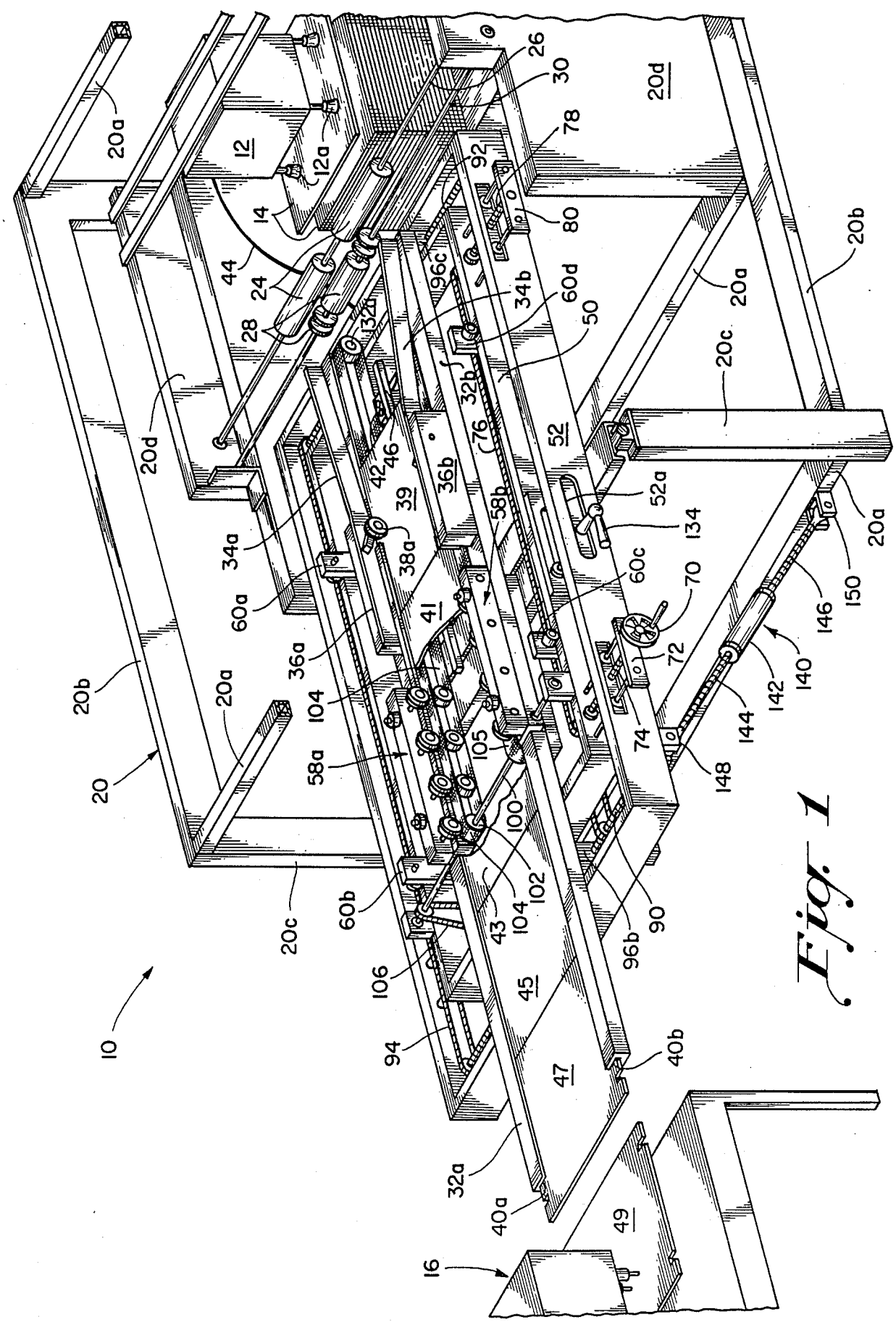
FIG. 1 is a partially cutaway upper perspective view of an automated belt drive PC board feed apparatus in accordance with the present invention.
Figure 4:
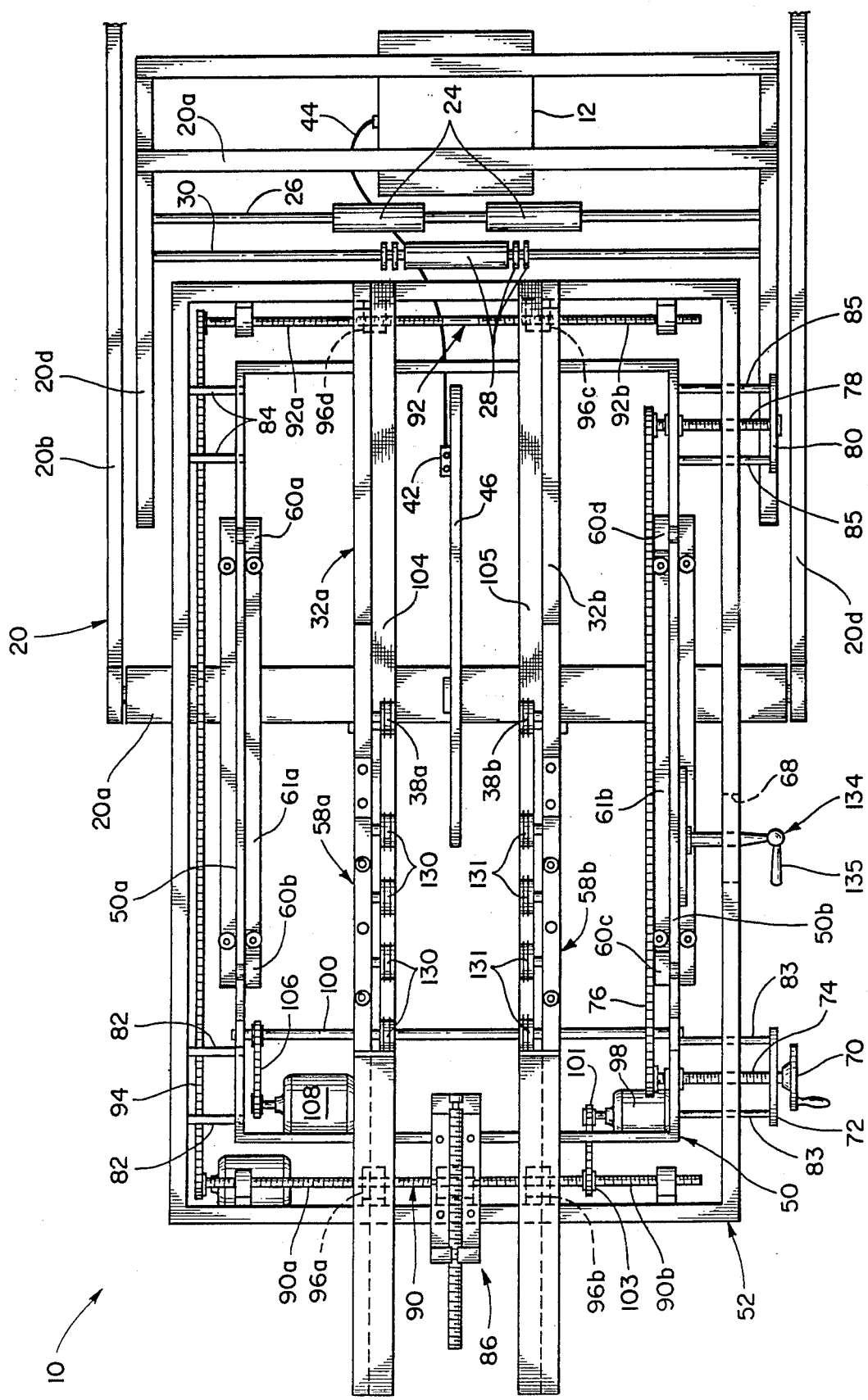
FIG. 4 is a top plan view of the automated belt drive PC board feed apparatus of FIG. 1.

Referring to FIGS. 1 and 4, there are respectively shown upper perspective and top plan views of an automated belt drive PC board feed apparatus 10 in accordance with the present invention.

The PC board feed apparatus 10 is adapted to sequentially receive a plurality of PC boards 14 from a pick-up or loader mechanism 12. The pick-up mechanism 12 may include a plurality of vacuum cups 12a which are adapted to engage a surface of a PC board 14, lift the PC board from a stack of boards, and displace the thus removed PC board toward the PC board feed apparatus 10. Similarly, the PC board feed apparatus 10 provides the PC boards which it receives from the pick-up mechanism 12 to a processing station 16. The PC board feed apparatus 10 of the present invention may be used at various stages in the processing of the PC boards for transporting the PC boards at high speed from one stage or station in their fabrication to another stage or station for subsequent processing.

The PC board feed apparatus 10 includes a support frame 20 preferably comprised of a high strength metal such as steel and including a plurality of cross members 20a, longitudinal members 20b, vertical members 20c, and a pair of lateral walls 20d. The support frame 20 is generally rectangular in shape and provides support for various components of the PC board feed apparatus 10 described in the following paragraphs.

Positioned between and coupled to facing portions of the support frame's lateral walls 20d are upper and lower support rods 26 and 30. Positioned on the upper support rod 26 and free to rotate thereon are a pair of upper feed rollers 24. Similarly, a plurality of lower feed rollers 28 are rotationally positioned on the lower support rod 30 adjacent to the center portion thereof. The upper and lower feed rollers 24, 28 are spaced so as to receive in somewhat tight fitting engagement a PC board 14 positioned by the pick-up mechanism 12 therebetween.

As the PC board is positioned between and displaced over the upper and lower feed rollers 24, 26 by the pick-up mechanism 12, it is positioned upon right and left endless drive belts 104, 105. As used herein, the terms "right" and "left" refer to portions of the PC board feed apparatus 10 when viewed from the direction of the pick-up mechanism 12. Similarly, the "forward" portion of the PC board feed apparatus 10 is positioned adjacent to the pick-up mechanism 12, while the "aft" portion of the PC board feed apparatus 10 is positioned adjacent to the processing station 16.

Each of the endless drive belts 104, 105 is rotationally displaced by means of a respective drive roller 102 in the right and left belt feeder assemblies 58a, 58b. The drive belts 104, 105 are rotationally displaced such that the respective upper portions thereof move from the forward toward the aft portion of the PC board feed apparatus 10. Thus, PC boards positioned on the forward portions of the right and left drive belts 104, 105 via the upper and lower feed rollers 24, 28 are displaced by the drive belts toward the processing station 16. Positioned above and outward from the right and left drive belts 104, 105 are right and left lateral guide rails 34a, 34b which are angularly oriented relative to each other so as to direct PC boards deposited upon the drive belts toward a center line disposed between the drive belts. The right and left lateral guide rails 34a, 34b thus compensate for variation in lateral positioning of the PC boards as they are discharged from the upper and lower feed rollers 24, 28 for ensuring that respective edge portions of the PC boards are aligned with and positioned upon the right and left drive belts 104, 105.

Positioned adjacent to the right and left drive belts 104, 105 are respective right and left support rails 32a, 32b. Each of the right and left support rails 32a, 32b is provided with a respective slot 40a, 40b along the length thereof. The slots 40a, 40b are in facing relation and are adapted to receive respective lateral edges of a PC board inserted therein. To facilitate positioning of the edges of a PC board within the slots 40a and 40b of the right and left support rails 32a, 32b, right and left guide rollers 38a, 38b are pivotally coupled to the right and left support rails, respectively, by means of a respective guide roller mounting block 36a, 36b. As shown in the lateral views of the right guide roller mounting block 36a and the right belt feeder assembly 58a of FIGS. 2 and 3, each of the guide rollers is free to pivot upward and downward when engaged by a PC board such as shown for the case of PC board 39 in FIGS. 1 and 2. The right and left guide rollers 38a, 38b urge respective lateral edge portions of a PC board downward so that the PC board assumes a generally planar configuration in the case of a PC board distorted by warpage to facilitate insertion of respective lateral edge portions of the PC board into the slots 40a, 40b of the right and left support rails 32a, 32b. Once its lateral edge portions are positioned within the slots 40a, 40b, the PC board is maintained in a flat configuration regardless of the amount of nonplanar distortion it possesses in the free or unrestrained state. In this manner, the PC board feed apparatus 10 of the present invention is capable of accommodating nonplanar PC boards exhibiting large deviations from flatness. As shown in FIG. 1, the PC board feed apparatus 10 is capable of engaging and transporting a plurality of PC boards 39, 41, 43, 45 and 47 during normal operation. PC board 49 has just been discharged from the PC board feed apparatus 10 and has been deposited at the processing station 16 for subsequent processing. Thus, the PC board feed apparatus 10 is capable of simultaneously displacing a plurality of PC boards arranged in edge-to-edge contact at high speed from right to left as viewed in FIGS. 1 and 4.

Figure 2:
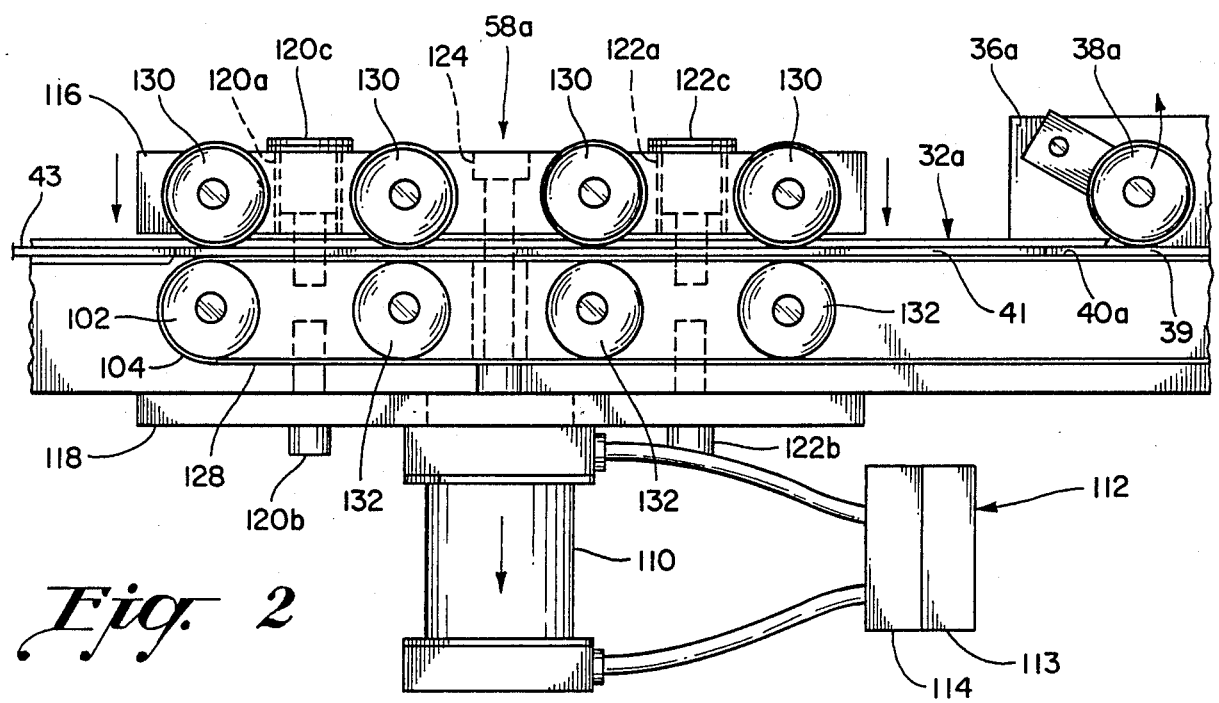
FIG. 2 is a lateral view, shown partially in phantom, of a belt feeder assembly engaging and displacing a PC board as used in the automated belt drive PC board feed apparatus of FIG. 1.
Figure 3:
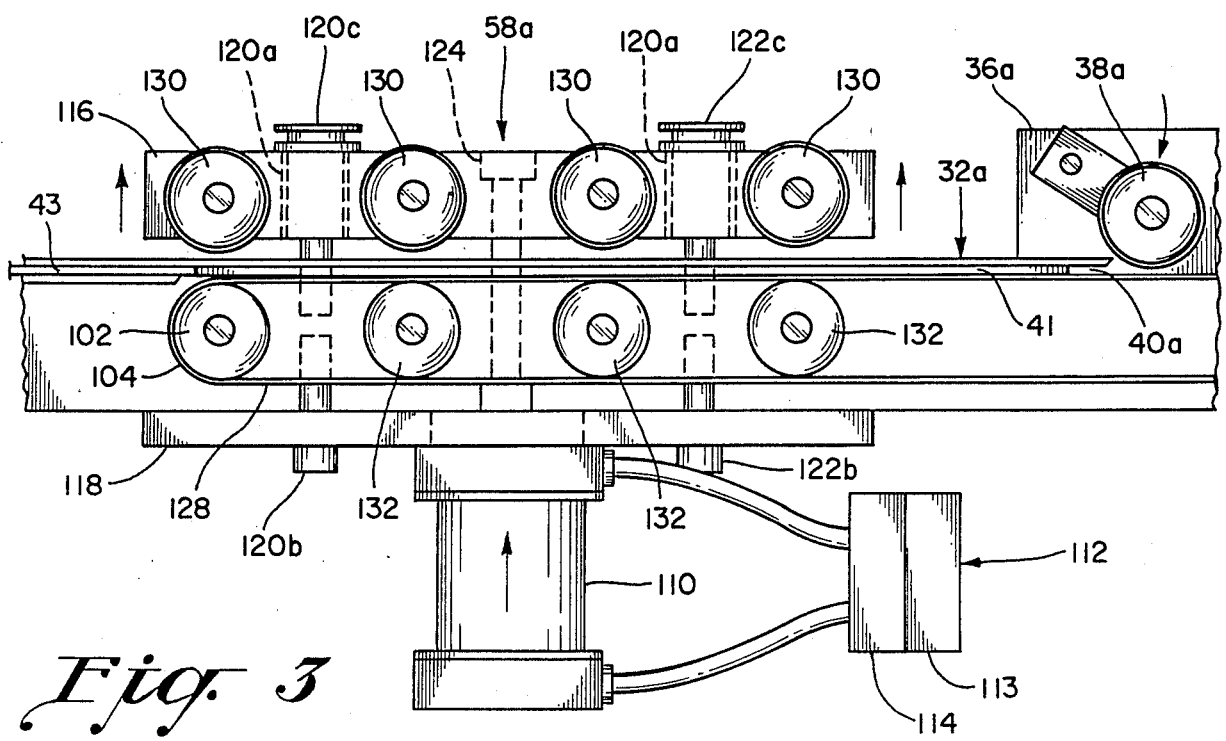
FIG. 3 is a lateral view, shown partially in phantom, of the belt feeder assembly of FIG. 2 as positioned when not engaging and displacing a PC board.

Referring again to FIGS. 2 and 3, there are shown details of the right belt feeder assembly 58a used in a preferred embodiment of the PC board feed apparatus 10. The left belt feeder assembly has a similar construction and is characterized by identical operation and is thus not described in detail herein. Each of the right and left belt feeder assemblies 58a, 58b includes a respective drive belt 104, 105. As shown in FIGS. 2 and 3 for the case of the right belt feeder assembly 58a, the belt feeder assemblies also each include an upper roller support bracket 116 and a cylinder support bracket 118. Rotationally coupled to and positioned along the length of the upper roller support bracket 116 are a plurality of upper idler rollers 130. The upper roller support bracket 116 and the cylinder support bracket 118 are mounted to the right support rail 32a by means of first and second pairs of coupling pins 120a, 122a. The upper ends of each of coupling pins 120a and 122a each include a respective adjustable threaded insert 120c, 122c which permit the spacing between the upper roller support bracket 116 and the right support rail 32a to be adjusted as desired. Thus, the upper roller support bracket 116 may be displaced toward or away from the cylinder support bracket 118 by rotationally displacing the threaded inserts 120c and 122c.

Rotationally mounted to the right support rail 32a along a portion of the length thereof are a plurality of lower idler rollers 132, each of which is positioned immediately below and in close spaced relation to a respective upper idler roller 130. Also rotationally mounted to the right support rail 32a is the drive roller 102. The right drive belt 104 is thus positioned about and supported by the drive roller 102, the plurality of lower idler rollers 132, and a forward guide roller 132a positioned in the forward end portion of the PC board feed apparatus 10 adjacent to the upper and lower feed rollers 26, 28 as shown in FIG. 1. A similar combination of drive and idler rollers supports and provides for the displacement of the left drive belt 105.

Each of the drive rollers 102 is coupled to and rotationally displaced by means of a drive shaft 100 which, in turn, is rotationally displaced by a drive motor 108. One end of the drive shaft 100 is coupled to the drive motor 108 by means of the combination of a sprocket and an endless drive chain 106. Thus, each of the PC boards is sequentially placed on a forward portion of the rotating right and left drive belts 104, 105 and is linearly displaced by the drive belts as described in the following paragraphs.

Securely mounted to a lower portion of each of the cylinder support brackets 118 is a respective pneumatic cylinder 110. The pneumatic cylinder 110 includes a cylinder rod 124 coupled at its distal end to the upper roller support bracket 116. In a preferred embodiment, the pneumatic cylinder 110 is a double acting cylinder such that its cylinder rod 124 may be extended from and retracted into the pneumatic cylinder in response to appropriate application of pneumatic pressure provided from a controller 112 to the pneumatic cylinder. The controller 112, which would typically control operation of both the right and left pneumatic cylinders, generally includes a timer 113 and a pneumatic pressure source 114. The pneumatic cylinders in a preferred embodiment are 5-way air valves. In response to timed control signals from the timer 113, the pneumatic pressure source 114 provides pneumatic pressure to either the rod or butt end of the pneumatic cylinder 110 for extending or retracting the cylinder rod 24 therein. With the upper support bracket 116 securely coupled to the distal end of the cylinder rod 124, extension or retraction of the cylinder rod results in respective displacement of the upper roller support bracket 116 away from or toward the cylinder support bracket 118. As shown in FIG. 2, the upper roller support bracket 116 has been displaced toward the cylinder support bracket 119 such that the upper idler rollers 130 engage an upper surface of the PC board 41, forcing the PC board downward and in secure engagement with the rotationally displaced drive belt 104 causing the PC board to be displaced leftward in the figure. As shown in FIG. 3, the upper roller support bracket 116 has been displaced away from the cylinder support bracket 118 by the extension of the pneumatic cylinder's rod 124 resulting in disengagement of the upper idler rollers 130 from the upper surface of the PC board 41. With the upper idler rollers 130 no longer forcing the PC board 41 downward in secure engagement with the drive belt 104, PC board 41 remains positioned between the upper roller support bracket 116 and the cylinder support bracket 118 and is not displaced leftward.

It should also be noted that in FIG. 3, PC board 39 is not shown as positioned in contact with the guide roller 38a and inserted within the support rail's slot 40a in order to illustrate the pivoting nature of the guide rollers. However, during normal operation the PC board 39 would be moved into position in contact with the guide roller 38a and in the slot 40a by means of the right and left drive belts 104, 105. Thus, each PC board is sequentially delivered to the receiving end of the belt feeder assemblies 58a 58b, is positioned in contact with the respective guide rollers 38a, 38b, and is sequentially displaced by means of engagement with the rotationally displaced guide belts 104 and 105 as previously described. The timed operation of the belt feeder assemblies 58a, 58b is sycnchronized with the sequential delivery of PC boards to the PC board feeder apparatus 10 by the pick-up mechanism 12. Thus, each of the PC boards is sequentially displaced by the pick-up mechanism 12 to a location between the right and left belt feeder assemblies 58a, 58b, with each PC board then engaged and linearly displaced within the slots 40a, 40b of the right and left support rails 32a, 32b by means of the rotationally displaced right and left drive belts 104, 105.

By adjusting the displacement between each of the upper roller support brackets 116 and its associated adjacent cylinder support bracket 118, the force applied by the drive belts to a PC board may be fixed as desired. For example, by moving the upper roller support brackets 116 downward by means of the threaded inserts 120c, 122c toward its associated cylinder support bracket 118, the torque applied to the PC boards may be increased. It may be desired to increase the displacement force applied to the PC boards where the PC boards are large in size or highly warped in shape.

The automatic belt drive PC board feed apparatus 10 includes generally rectangular inner and outer frames 50, 52. The inner and outer frames 50, 52 are generally planar, with the inner frame positioned within the outer frame. The inner and outer frames 50, 52 are securely coupled to each other as described below.

Rotationally mounted to respective forward and aft portions of the outer frame 52 are first and second double threaded screws 90 and 92. The first double threaded screw 90 is coupled by means of the combination of an endless drive chain 101 and sprocket 103 to a drive motor 98. Similarly, the first double threaded screw 90 is coupled to the second double threaded screw 92 by means of the combination of a pair of sprockets and an endless chain 94. Thus, rotational displacement of the first double threaded screw 90 in response to actuation by the drive motor 98 will cause a corresponding rotation in the same direction by the second double threaded screw 92.

The first double threaded screw 90 includes first and second threaded portions 90a, 90b which are of opposite orientation. Similarly, the second double threaded screw 92 includes first and second threaded portions 92a, 92b, with one portion having left-hand threads and the other portion having right-hand threads. The first threaded portion 90a of the first double threaded screw 90 is coupled to a lower portion of the right support rail 32a by means of a threaded coupling bracket 96a, while its second threaded portion 90b is coupled to the left support rail 32b by means of a second threaded coupling bracket 96b. The first and second threaded portions 92a, 92b of the second double threaded screw 92 are similarly respectively coupled to the right and left support rails 32a, 32b by means of a respective threaded coupling bracket 96d and 96c. Thus, with the threaded portions of each of the double threaded screws 90, 92 of opposite orientation, the synchronous rotation of the first and second double threaded screws 90, 92 in response to actuation by the drive motor 98 will result in displacement of the right and left support rails 32a, 32b toward or away from each other. In this manner, the spacing between the right and left support rails 32a, 32b may be adjusted to accommodate a range of PC board widths. It should be noted here that each of the drive rollers 102 is provided with a clutch bearing to facilitate linear displacement of the drive rollers along the drive shaft 100 as the right and left support rails 32a, 32b are moved toward or away from each other.

As indicated above, the inner rectangular frame 50 is positioned within the outer rectangular frame 52. First and second pairs of alignment/support pins 82, 84 couple a first pair of adjacent lateral portions of the inner and outer frames 50, 52. Each of the first and second pairs of alignment/support pins 82, 84 is fixedly mounted to an inner portion of the outer frame's lateral member and is inserted within a respective aperture in the inner frame 50 and is freely displaceable therein. Thus, the right hand portion of the inner frame 50 is supported by, yet movable with respect to, the adjacent lateral portion of the outer frame 52. Third and fourth pairs of alignment/support pins 83, 85 are securely affixed to the facing lateral member of the inner frame 50 and are inserted through respective apertures in the adjacent lateral member of the outer frame 52. Thus, the left hand portion of the inner frame 50 is securely supported by, yet movable with respect to, the adjacent lateral portion of the outer frame 52. Therefore, the inner frame 50 is supported by the outer frame 52 and may be laterally displaced relative to the outer frame.

Affixed to the outer, distal end portions of each of the third and fourth pairs of alignment/support pins 83, 85 are respective first and second mounting brackets 72, 80. Rotationally mounted to the first and second mounting brackets 72, 80 as well as to the adjacent lateral portion of the inner frame 50 and extending through respective slots in the outer frame 52 are first and second threaded shafts 74 and 78, respectively. The inner end portions of the first and second threaded shafts 74, 78 are coupled by means of the combination of a pair of sprockets and an endless chain 76. A hand crank 70 is securely mounted to the outer end portion of the first threaded shaft 74. Rotational displacement of the hand crank 70 results in corresponding rotational displacement of the first threaded shaft 74 as well as the second threaded shaft 78 which are coupled together by means of the endless chain 76. With each of the first and second threaded shafts 74, 78 threadably positioned within and engaging the lateral portion of the outer frame 52 and securely attached to the adjacent, facing lateral portion of the inner frame 50, rotational displacement of the first and second threaded shafts will result in lateral displacement of the inner frame relative to the outer frame. In this manner, the inner frame 50 may be laterally displaced with respect to the outer frame 52 for aligning the right and left support rails 32a, 32b with the pick-up mechanism 12 and/or the processing station 16. Movement of the entire automated belt drive PC board feed apparatus 10 is thus not necessary for precise alignment of the PC board handling portion of the feed apparatus with the PC board supply and take-up mechanisms.

Securely mounted to the cross member 20a of the support frame 20 and extending along the longitudinal axis of the PC board feed apparatus 10 are right and left support beams 61a and 61b. Mounted to opposing end portions of the right support beam 61a are coupling brackets 60a and 60b. Similarly, mounted to opposing end portions of the left support beam 61b are coupling brackets 60c and 60d. Details of coupling brackets 60b and 60c are shown in FIG. 6 and described in the following paragraphs.

Figure 6:
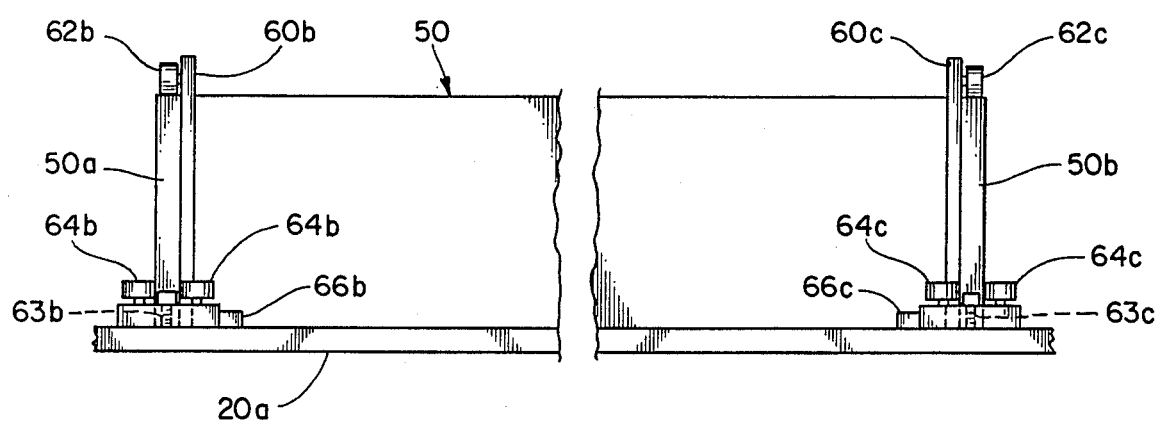
FIG. 6 illustrates the manner in which the inner frame of the automated belt drive PC board feed apparatus of the present invention is coupled to its outer frame and to the support frame to facilitate relative displacement therebetween.

Each of the coupling brackets, as shown for the case of brackets 60b and 60c in FIG. 6, include an upper roller, shown as roller 62b in coupling bracket 60b and roller 62c in coupling bracket 60c. Coupling brackets 60b and 60c further include a respective pair of lower rollers 64b, 64c and a respective lower roller 63b, 63c. The roller arrangement of each of the coupling brackets 60b, 60c is such as to engage respective upper, lower and lateral portions of the lateral members 50a, 50b of the inner frame. The four roller assemblies on each of the coupling brackets 60a, 60b, 60c and 60d facilitate relative movement between the combination of the coupled inner and outer frames 50, 52 and the support frame 20. Thus, the inner and outer frames 50, 52 are freely displaceable forward and aft along the longitudinal axis of the PC board feed apparatus 10. Since the right and left support rails 32a, 32b are mounted to the inner and outer frames 50, 52, the support rails are also movable along the longitudinal axis of the PC board feed apparatus 10 for positioning adjacent to the pick-up mechanism 12 and the processing station 16.

Attached to an outer portion of the left support beam 61b in a threaded manner is a locking mechanism 134. Attached to a distal end of the locking mechanism 134 is a handle 135 by means of which the locking mechanism may be rotationally displaced in its threaded engagement with the left support beam 61b. When rotated in one direction, the locking mechanism 134 is displaced toward the left inner frame side member 50b and securely engages this portion of the inner frame 50 to prevent relative movement between the inner frame and the support frame 20 to which the left support beam 61b is mounted. Similarly, rotation of the locking mechanism in the opposite direction disengages the locking mechanism from the left inner frame side member 50b and permits the inner frame 50 to be linearly displaced relative to the support beams 61a, 61b and the support frame 20. The locking mechanism 134 is positioned within an elongated slot 68 in a lateral portion of the outer frame 52 to permit relative displacement between the inner and outer frames along the longitudinal axis of the PC board feed apparatus 10. In this manner, the inner frame 50 and the outer frame 52 as well as the right and left support rails 32a, 32b may be moved along the longitudinal axis of the PC board feed apparatus 10 to allow for precise allignment of the support rails relative to the pick-up mechanism or loader 12 and the processing station 16.

Securely mounted to the cross member 20a of the support frame 20 and aligned along the longitudinal axis of the PC board feed apparatus is an elongated, linear support bar 46. Affixed to the support bar 46 is an optical sensor 42 which is coupled, by means of a lead 44 to the PC board pick-up mechanism or loader 12. The optical sensor 42 includes a light emitting element in combination with a light detecting element for detecting the presence of a PC board immediately above the sensor and providing an appropriate control signal via lead 44 to the pick-up mechanism 12. Thus, when the sensor 42 does not detect a PC board immediately above it indicating that the drive belts have moved the previously delivered PC board to the support slots 40a, 40b, the sensor provides an appropriate control signal to the pick-up mechanism 12 for initiating delivery of the next PC board to the PC board feed apparatus 10. So long as a PC board is positioned above the sensor 42, its optical receiver will receive the reflected light and a control signal for initiating delivery of the next PC board will not be provided to the pick-up mechanism 12. In this manner, the optical sensor 42 monitors operation of the PC board feed apparatus 10 and provides an automatic feed signal to initiate delivery of the next PC board after the preceding PC board has been displaced out of the way to prevent jamming of the PC board feed apparatus, damage to the PC boards, and possible injury to an operator.

Figure 5:
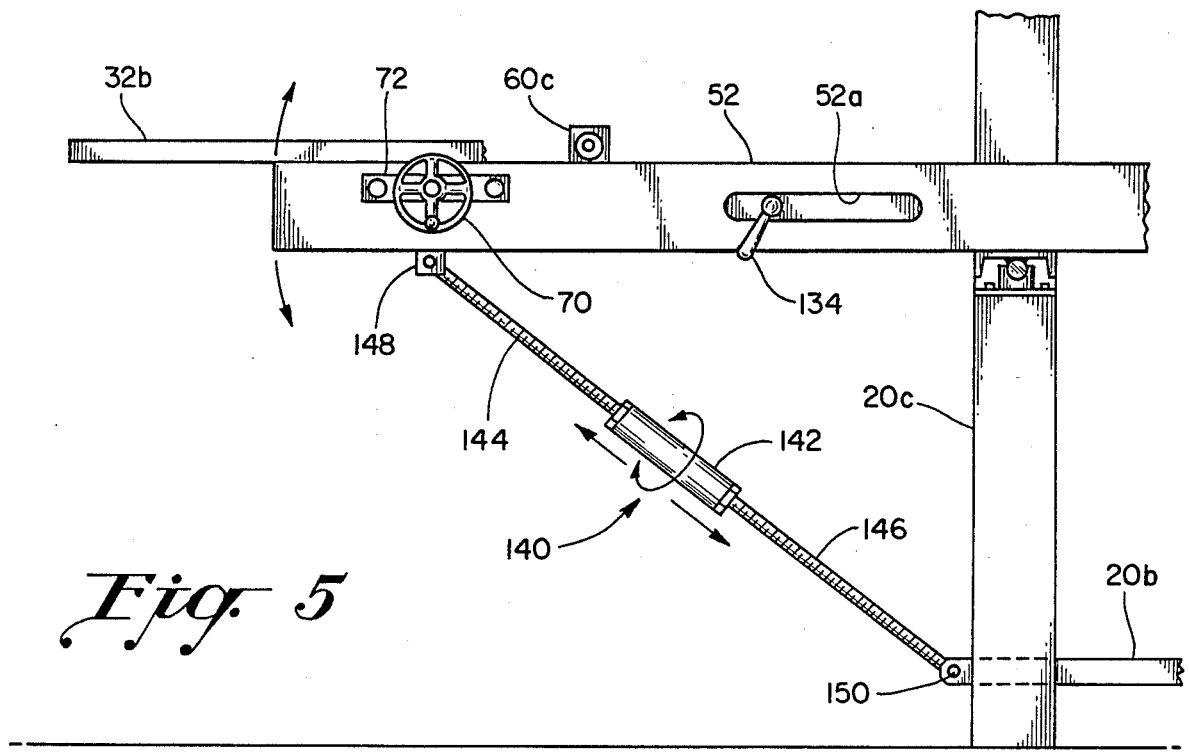
FIG. 5 is a lateral view of an aft portion of the automated belt drive PC board feed apparatus of FIG. 1 illustrating the tilt adjustment mechanism therein.

Referring to FIG. 5, there is shown a tilt adjust mechanism 140 for use in the aft portion of the PC board feed apparatus 10 which permits the level or elevation at which the PC boards are delivered to the processing station 16 to be adjusted as desired. The tilt adjust mechanism 140 includes an internally dual theaded coupler 142 which is mounted to respective ends of first and second threaded shafts or screws 144 and 146. Opposite ends of the first and second threaded shafts 144, 146 are respectively pivotally mounted to an upper coupling bracket 148 and a lower coupling bracket 150. The upper coupling bracket 148 is mounted to a rear, lower portion of the outer frame 52, while the lower coupling bracket 150 is mounted to a longitudinal member 20b of the support frame 20. With the first and second shafts 144 and 146 having oppositely oriented threads, rotation in a first direction of the cylindrical coupler 142 having internal dual threads will draw the first and second threaded shafts toward each other, while rotation of the coupler in a second, opposite direction will result in displacement of the two threaded shafts away from one another. Displacement of the first and second threaded shafts 74, 78 toward one another will cause a downward tilting of the aft end portion of the outer frame 52, while displacement of the two threaded shafts away from each other will result in an upward tilting of the aft end portion of the outer frame 52. In this manner, the level or elevation at which the PC boards are discharged from the PC board feed apparatus 10 may be precisely adjusted for accurate deposit of the PC boards on the processing station 16.

Also positioned on an aft portion of the PC board feed apparatus 10 and mounted to the inner and outer frames 50, 52 thereof is a PC board support/transfer bracket 86. The support/transfer bracket 86 is positioned between the right and left support rails 32a, 32b and prevents the lower portion of a warped PC board being discharged from the feed apparatus 10 from engaging a PC board already deposited on the processing station 16. The PC board support/transfer bracket 86 thus maintains the PC boards generally flat as they exit the slots 40a, 40b and are discharged onto the processing station 16.

There has thus been shown an automatic belt drive PC board feed apparatus which provides for the high speed, continuous, jam-free displacement and precise positioning of PC boards. By sequentially displacing each PC board, a linear array of PC boards which are maintained in precise alignment by lateral edge-engaging slots may be linearly displaced and sequentially discharged onto a PC board take-up station for subsequent processing. Idler rollers guide even highly nonplanar PC boards into the aligned, spaced slots, while an optical sensor detects discontinuities in the thus displaced array of PC boards for terminating operation of the PC board supply mechanism in preventing damage to PC boards.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. Apparatus for transporting a plurality of PC boards aligned in a generally linear end-to-end array from a PC board supply to a PC board receiver, said apparatus comprising:

support means for engaging opposing lateral edges of the PC boards and maintaining each of the PC boards in a substantially planar configuration and in abutting contact with immediately adjacent forward and aft PC boards along substantially the entire lengths of respective leading and trailing edges threof; and drive means for sequentially engaging and displacing each of the PC boards at a fixed location on said support means in transporting the plurality of PC boards in a continuous manner along said support means, wherein said drive means is sequentially displaced toward so as to engage and away from so as to disengage each PC board in turn at said fixed location and wherein said drive means includes first and second spaced feeder assemblies alternately displaced toward and away from each PC board in a sequential manner for engaging and displacing each PC board in turn.

2. The apparatus of claim 1 wherein said support means includes a pair of spaced support rails positioned immediately adjacent to said drive means and having respective PC board receiving and discharge ends.

3. The apparatus of claim 2 wherein each support rail is elongated and substantially linear and includes a respective slot for receiving a lateral edge of a PC board in tight-fitting engagement.

4. The apparatus of claim 3 further comprising guide means positioned adjacent to respective receiving ends of said slots for directing the lateral edges of a PC board therein.

5. The apparatus of claim 4 wherein said guide means includes a pair of guide rollers each positioned adjacent to a respective receiving end of a slot.

6. The apparatus of claim 5 wherein each guide roller is pivotally mounted adjacent to a respective receiving end of a slot.

7. The apparatus of claim 2 further comprising means for varying the spacing between said support rails for accommodating PC boards having a range of widths.

8. The apparatus of claim 2 further comprising a support bracket positioned between said support rails adjacent to respective discharge ends thereof for engaging a lower portion of a warped PC board intermediate the opposed lateral edges thereof as said PC board is discharged from said apparatus in maintaining the warped PC board substantially flat as it is discharged from said apparatus.

9. The apparatus of claim 2 further comprising means for laterally displacing said support rails in aligning said support rails with respect to the PC board supply which includes a PC board loading device disposed adjacent to the PC board receiving end of said apparatus and the PC board receiver which includes a PC board receiving device disposed adjacent to the PC board discharge end of said apparatus.

10. The apparatus of claim 1 further comprising feed rollers for receiving the PC boards from a loading mechanism and directing the PC boards to said support means.

11. The apparatus of claim 1 further comprising sensor means coupled to a PC board loading mechanism for controlling the delivery of PC boards to the PC board transport apparatus.

12. The apparatus of claim 11 wherein said sensor means includes an optical sensor for detecting displacement of the last provided PC board and for providing an actuate signal to said PC board loading mechanism for initiating delivery of another PC board to the PC board transport apparatus.

13. The apparatus of claim 2 further comprising means for adjusting the elevation of the discharge ends of said spaced support rails.

14. The apparatus of claim 1 wherein each feeder assemble includes a plurality of displaceable idler rollers and a drive roller and drive belt combination for sequentially engaging each PC board.

15. The apparatus of claim 14 further comprising displacement means for displacing said idler rollers toward and away from said drive roller and drive belt combination.

16. The apparatus of claim 15 wherein said displacement means includes a pneumatic cylinder.

17. The apparatus of claim 14 further comprising means for selectively adjusting the force with which the drive roller and drive belt combination engages the PC boards.

18. The apparatus of claim 17 wherein said means for selectively adjusting the force with which the drive roller and drive belt combination engages the PC boards includes a threaded coupling member for adjusting the spacing between the idler rollers and the drive roller and drive belt combination.

* * * * *